United States Patent [19]

Craft

[11] 3,924,202

[45] Dec. 2, 1975

[54] ELECTRONIC OSCILLATOR

[75] Inventor: Jack Craft, Somerville, N.J.

[73] Assignee: RCA Corporation, New York, N.Y.

[22] Filed: Aug. 21, 1974

[21] Appl. No.: 499,290

[52] U.S. Cl. .................. 331/111; 331/8; 331/108 D

[51] Int. Cl.[2] ........................................... H03K 4/06

[58] Field of Search ............ 331/108 C, 108 D, 111, 331/8

[56] References Cited

UNITED STATES PATENTS

| | | | |
|---|---|---|---|
| 3,156,875 | 11/1964 | Fiorino et al. | 331/111 |
| 3,593,198 | 7/1971 | Karcher | 331/111 |
| 3,603,890 | 9/1971 | Camenzind | 331/108 D |
| 3,618,131 | 11/1971 | Garde | 331/111 |
| 3,659,224 | 4/1972 | Ball | 331/108 C |
| 3,824,494 | 7/1974 | Wilcox | 331/108 D |
| 3,857,110 | 12/1974 | Grebene | 331/108 D |

*Primary Examiner*—John Kominski
*Attorney, Agent, or Firm*—Eugene M. Whitacre; Thomas R. Farino, Jr.

[57] ABSTRACT

An oscillator suitable for construction in monolithic integrated circuit form includes a differential current steering circuit for controlling the charging and discharging of a capacitor. A single controlled current supply circuit is coupled to the differential current steering circuit, one half of which provides a current sink (source) for discharging (charging) the capacitor while the other half is coupled to the capacitor by means of a current mirror or inverter circuit to provide a current source (sink) for charging (discharging) the capacitor. An electronic switching circuit is also provided and includes a pair of transistors connected in differential fashion and responsive to the attainment of a predetermined charge on the capacitor relative to a reference potential to switch between charging and discharging the capacitor. One of the transistors of the pair is coupled to a current mirror for providing rapid turn-on/turn-off of the switching circuit. In a preferred embodiment, equal capacitor charge and discharge rates are provided to yield a symmetrical sawtooth wave and/or a square wave output. Means for altering the frequency of oscillation is also provided.

13 Claims, 2 Drawing Figures

ELECTRONIC OSCILLATOR

This invention relates to oscillator circuits and more particularly to circuits especially suited to integrated circuit technology.

More particularly, this invention relates to a differential amplifier control transistor oscillator suitable for generating substantially symmetrical waveforms of, for example, sawtooth or square wave form.

The invention described herein is particularly useful in the implementation of an oscillator which may be utilized in a phase-locked loop circuit in applications such as a CD-4 type four-channel audio decoder, integrated circuit or any other application where a phase-locked oscillator is desired.

Generally speaking, it is known to provide an oscillator by alternately connecting an energy storage device, such as a capacitor, to the outputs of a constant current source and a constant current sink with a switching device used to periodically charge and discharge the capacitor via the source and sink. Such configurations typically utilize separate supplies for the sink and source which must each be regulated to maintain proper frequency and waveshape control.

The invention described herein discloses circuitry for implementing an oscillator device actuated by a pair of transistors connected in a differential amplifier configuration. Although the invention is especially useful in the area of integrated circuits, the concepts and structure disclosed may also be employed with discrete components.

In accordance with this invention, a circuit is provided for charging and discharging a capacitor so as to yield a regularly recurring waveform such as a square wave or a sawtooth waveform. Current from a common transistor is applied to the emitters of a first and second transistor which together function as a current steering switch. When the first transistor is rendered conductive, charge is applied to the capacitor and when the second transistor is rendered conductive, charge is removed from the capacitor. A current mirror, repeater or inverter including, for example, a transistor and a diode coupled respectively to the first and second transistors, inverts the current associated with the first transistor and couples such inverted current to the capacitor. The system provides equal capacitor charge and discharge rates. A control circuit is provided wherein the current of the common transistor may be varied to yield a change in the capacitor charge and discharge rates corresponding to a change in frequency of oscillation. A toggling or switching circuit in conjunction with a positive feedback current mirror or inverter circuit is coupled to the current steering switch which it drives with the proper phase of feedback selected to cause sustained oscillation.

Figure 1:
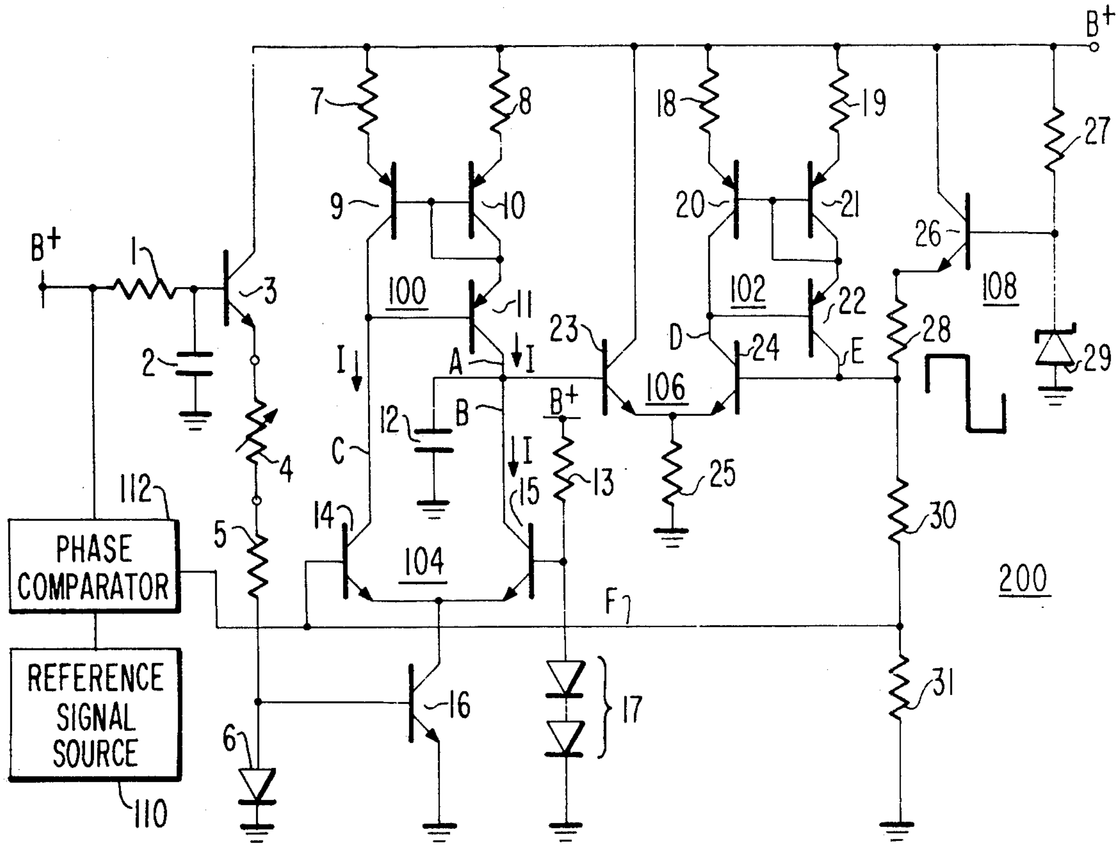
Figure 2:
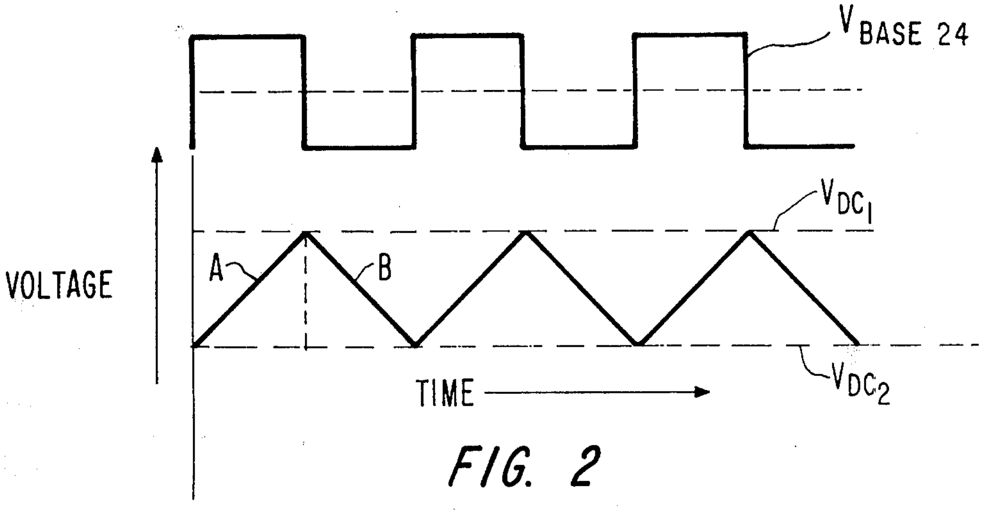

The present invention will be better understood by reference to the following specification and the accompanying drawings in which:

FIG. 1 shows in schematic form a controlled oscillator circuit embodying the present invention which is suitable for use in a CD-4 decoder integrated circuit; and FIG. 2 illustrates waveforms useful in describing the oscillator output.

Referring now to FIG. 1, a positive source of operating voltage is applied to a B+ terminal causing a regulating arrangement comprising a resistor 27 and a zener diode 29 to conduct to provide a predetermined voltage (e.g., +7 volts) across diode 29. A follower transistor 26 causes current to flow through a resistor string 28, 30 and 31 setting up proportional potentials at the resistor junctions. Bias current also flows through a control circuit comprising a transistor 3, a resistor string 4, 5 and a diode 6 producing a predetermined collector current in a controlled current supply transistor 16. The current through transistor 16 is applied to the emitters of transistors 14 and 15 connected in an emitter coupled differential amplifier configuration which serves as a current steering switch 104.

A capacitor 12, which may be fabricated in discrete form external to other illustrated elements of the combination, is coupled between a current mirror configuration 100 made up of a diode 10, transistors 11, 9 and degenerating resistors 7 and 8. Transistor 9 and diode 10 are of substantially identical construction to provide a current gain of unity. Capacitor 12 is charged via a first current path A from a current source comprised of transistors 16, 14 and current mirror 100 when transistor 14 is conductive and transistor 15 is nonconductive.

Capacitor 12 is discharged via a second current path B by means of a current sink comprised of transistors 14 and 15 when transistor 15 is conductive and transistor 14 is nonconductive.

A reference bias supply arrangement comprising the series combination of resistor 13 and diodes 17 (shown as two diodes for providing substantially $2V_{be}$ or approximately 1.4 volts) is coupled between the B+ terminal and ground. Diodes 17 supply bias to the base of transistor 15.

A comparator switch or toggle circuit 106 is coupled to capacitor 12. The base of a transistor 24 of the toggling circuit configuration 106 is supplied with a DC reference potential from the diode bias configuration 108 comprised of zener diode 29, transistor 26 and resistor 28.

This potential provides the necessary bias to render transistor 24 normally conductive, which in turn renders transistor 23 nonconductive by virtue of the differential configuration in which they are connected, the emitters of transistors 23 and 24 being connected in common through a resistor 25 which, in turn, is connected to ground. The junction of resistors 30 and 31 also provides bias to the base of transistor 14 of current steering switch 104.

A second current mirror 102 comprising transistors 22, 20, diode 21 and degenerating resistors 18, 19 is coupled between the base and collector of transistor 24 in a regenerative feedback arrangement. Transistor 20 and diode 21 are of substantially identical construction to provide a current gain of unity.

In the operation of the oscillator, current source 16 supplies a current I to the current steering switch 104. With transistor 15 nonconductive and transistor 14 conductive, current I is coupled by transistor 14 to current mirror circuit 100 via path C. Current mirror circuit 100, as is well known with respect to mirror circuits of this type, will also cause substantially the same current I to flow in circuit path A. This current I is then coupled to charging capacitor 12 and the capacitor begins to charge which represents the charge cycle of the oscillator waveform designated "A" in FIG. 2. So long as the voltage across the capacitor 12 is less than $V_{DC1}$ (the voltage at the base of transistor 24) the transistor 24 of the differential switch 106 is conductive, which in turn maintains transistor 23 nonconductive.

The conduction of transistor 24 causes regenerative mirror 102 to conduct sufficient current to raise the voltage across resistor 31 above that at the base of transistor 15. This maintains transistor 14 in a conductive condition, which in turn maintains 15 of steering switch configuration 104 in a nonconductive state by virtue of the differential configuration in which they are connected.

Since the capacitor 12 is charged from a constant current source, the potential or charge stored by the capacitor rises in a linear fashion established by the parameters of the current source 14 and mirror circuit 100. This linear rise in potential is illustrated in FIG. 2 and comprises the rising portion of the serrasoid (sawtooth) waveform A.

As the charge on capacitor 12 reaches the value $V_{DC1}$ as depicted in FIG. 2, the transistor 23, whose base is coupled to capacitor 12, is rendered conductive. At the same time, transistor 24 becomes nonconductive due to the differential configuration in which transistor 23, 24 are connected. Mirror circuit 102, which is coupled to transistor 24 in regenerative feedback fashion, enables the toggling circuit 106 to quickly change state and thus control the current steering switch 104 to provide the alternate charge and discharge cycles for capacitor 12. As the conductivity of transistor 24 begins to decrease, the collector current of 24 accordingly decreases in circuit path D. Current mirror circuit 102 provides equal current paths D and E. Therefore, as the collector current of 24 decreases in path D, current mirror 102 will cause a reduced current to be coupled to the base of transistor 24 in regenerative fashion thereby causing rapid turn-off of 24. The nonconduction of transistor 24 in turn renders 14 nonconductive by reducing the potential at its base electrode. The nonconduction of transistor 14 causes the inactivation of current mirror 100 to which it is coupled via path C. Concurrent with the nonconduction of transistor 14 and mirror circuit 100, transistor 15 is rendered conductive due to its differential coupling with transistor 14 and bias coupling with diode arrangement 17. With transistor 14 and mirror circuit 100 nonconductive, the only operative connection to the capacitor 12 is path B to which is coupled discharge current sink 15, 16, by which the discharge cycle takes place as depicted by ramp B in FIG. 2.

Since capacitor 12 is discharged from a constant current sink, the charge removed from the capacitor decreases in a linear fashion established by the parameters of the current sink 15, 16. This linear decrease in potential is illustrated in FIG. 2 and comprises the falling portion, B, of the serrasoid (sawtooth) waveform.

Since transistors 14 and 15 are manufactured on the same integrated circuit chip and designed to have identical operating characteristics and couple the same current supply 16 to capacitor 12, the charge and discharge rates of capacitor 12 are equal thereby producing a substantially symmetrical serrasoid (sawtooth) waveform as depicted in FIG. 2.

When the voltage on capacitor 12 drops to a level which is just below the voltage level at the base electrode of transistor 24, transistor 23, which is coupled to capacitor 12, becomes nonconductive. This resultant nonconductive state of transistor 23 causes transistor 24 to turn on due to the differential coupling with transistor 23. As transistor 24 begins to turn on, the collector current in path D accordingly increases; and through current mirror 102, an equally increased current is coupled to the base of transistor 24 in regenerative fashion thereby causing rapid turn-on of transistor 24. This condition coupled through network 104 causes the charge on capacitor 12 to approximate the reference potential $V_{DC2}$ as shown in FIG. 2. The conduction of transistor 24 thereby causes the turn-on of transistor 14 to which it is coupled which in turn reverse biases transistor 15 thereby rendering 15 nonconductive, and the next charge cycle of capacitor 12 is initiated. Charge then commences building on the capacitor 12 at a rate determined by the rate of current supplied by the constant current source made up of transistors 16, 14 and 11.

When the oscillator circuit 200, shown in FIG. 1, is used as the oscillator component of a phase-locked loop for a CD-4 demodulator circuit, the square wave developed across resistor 31 (or 30), may be used as the oscillator output signal. In such a configuration, an input reference signal source 110 (FIG. 1), typically a signal with a frequency of 30KHz, is coupled to a phase comparator 112 wherein the phase of the oscillator output signal is compared to the input reference signal via feedback path F. The low-pass filter network comprised of resistor 1 and capacitor 2 causes an appropriate error signal to be generated which is applied to the control input terminal (the base of 3) of the oscillator with the proper polarity to reduce the phase difference to a reference value. Thus, the variations in the oscillator output signal will be corrected to hold the oscillator output frequency substantially identical with the input reference signal. For the same reasons, any change in the input reference signal will be tracked by the oscillator. The center frequency of oscillation can be varied and is set by the variable resistor 4 which is located outside the integrated circuit. Also, the rates of charge and discharge of capacitor 12 may be varied corresponding to a change in frequency of oscillation. This is accomplished by changing the voltage on the base of 3 which in turn produces a corresponding change in the collector current of transistor 16; this yields a changed rate of charge and discharge of capacitor 12.

Additional applications may be realized by the circuitry depicted in the schematic diagram of FIG. 1. For example, when the oscillator is employed as part of a phase-locked loop circuit in a CD-4 type four-channel audio decoder, a carrier presence detection function is usually involved. Since the voltage controlled oscillator in a phase-locked loop normally phase locks 90 degrees out-of-phase from the incoming reference signal, its normal square wave output cannot be used to supply the reference signal in the carrier presence detector. The circuit shown in FIG. 1 provides means for utilizing a portion of the symmetrical sawtooth waveform from the oscillator for the needed in-phase reference signal. Such a signal may be provided, for example, by an additional emitter follower transistor, the base of which is coupled to the capacitor 12. Other alternatives or improvements will occur to persons of ordinary skill.

What is claimed is:

1. An oscillator circuit comprising:

a current source;

current steering means coupled to said current source and responsive thereto for providing first and second current paths;

a charge storage device coupled to one of said current paths;

current repeater means coupled to the other of said current paths and to said charge storage device, said current repeater means and said current steering means providing alternate charge and discharge paths for said charge storage device; and regenerative switching means coupled to said charge storage device and responsive to the charge condition thereof for providing rapid transition of said current steering means from conduction in said one path to said other path.

2. An oscillator circuit according to claim 1 wherein said current repeater means and said current steering means provide substantially equal currents in said charge and discharge paths.

3. An oscillator circuit according to claim 2 wherein said current source is arranged to provide a substantially constant current.

4. An oscillator circuit according to claim 3 wherein said regenerative switching means provides repetitive alternate energization of said current paths.

5. An oscillator circuit according to claim 4 wherein said current steering means comprises first and second transistors connected in differential fashion having respective emitter electrodes coupled to each other and to said current source, respective collector electrodes coupled to said current repeater means and said charge storage device respectively, and respective base electrodes coupled to said regenerative switching means and a source of bias respectively, for providing alternate periods of conduction and nonconduction in said first and second transistors thereby effecting charge and discharge of said charge storage device respectively.

6. An oscillator circuit according to claim 1 wherein said regenerative switching means comprises first and second transistors connected in differential fashion and a second current repeater means coupled to said second transistor, said transistors having respective emitter electrodes coupled to each other, respective collector electrodes coupled to said source of operating potential and said second current repeater means respectively, and base electrodes coupled to said charge storage device and said current steering means respectively, for providing selective energization of said current paths.

7. An oscillator circuit according to claim 6 wherein said repetitive alternate energization of said first and second current paths is arranged to produce a substantially sawtooth voltage across said charge storage device.

8. An oscillator circuit according to claim 7 wherein said regenerative switching means is arranged to include an output terminal at which is produced a substantially square wave voltage.

9. An oscillator circuit according to claim 8 wherein the square wave and sawtooth voltages are in substantially quadrature phase relationship.

10. An oscillator circuit as described in claim 1 wherein said current steering means comprises first and second transistors connected in differential fashion having respective emitter electrodes coupled to each other and to said current source, respective collector electrodes coupled to said current repeater means and said charge storage device respectively, and respective base electrodes coupled to said current steering control means and a source of bias respectively, for providing alternate periods of conduction and nonconduction in said first and second transistors thereby effecting charge and discharge of said charge storage device respectively.

11. An oscillator circuit comprising:

a current source;

a source of operating potential;

current steering means coupled to said current source and responsive thereto for providing first and second current paths;

a charge storage device coupled to one of said current paths;

current repeater means coupled to the other of said current paths and to said charge storage device, said current repeater means and said current steering means providing alternate charge and discharge paths for said charge storage device; and regenerative switching means responsive to a charge condition of said charge storage device for biasing said current steering means and thereby providing rapid transition of said current steering means from conduction in said one path to said other path.

12. An oscillator circuit as described in claim 11 wherein said switching means comprises first and second transistors connected in differential fashion and a second current repeater means coupled to said second transistor, said transistors having respective emitter electrodes coupled to each other, respective collector electrodes coupled to said source of operating potential and said second current repeater means respectively and base electrodes coupled to said charge storage device and said current steering means respectively for providing selective energization of said current paths.

13. An oscillator circuit as described in claim 12 wherein said second current repeater means comprises at least a transistor and a diode having respective emitter and anode electrodes coupled to said source of operating potential, respective base and cathode electrodes coupled to each other and to the collector electrode of said second transistor of said switching means and the collector electrode of said transistor coupled to the base electrode of said transistor of said switching means.

* * * * *